United States Patent
Hager, IV et al.

(10) Patent No.: US 7,977,224 B2
(45) Date of Patent: Jul. 12, 2011

(54) METHOD USING MULTIPLE LAYER ANNEALING CAP FOR FABRICATING GROUP III-NITRIDE SEMICONDUCTOR DEVICE STRUCTURES AND DEVICES FORMED THEREBY

(75) Inventors: Carl Emmett Hager, IV, Dunkirk, MD (US); Michael Andrew Derenge, Columbia, MD (US); Kenneth Andrew Jones, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 301 days.

(21) Appl. No.: 12/327,497

(22) Filed: Dec. 3, 2008

(65) Prior Publication Data
US 2010/0133656 A1    Jun. 3, 2010

(51) Int. Cl.
H01L 21/265 (2006.01)
(52) U.S. Cl. .................. 438/522; 438/902; 257/E21.12; 257/E21.34
(58) Field of Classification Search .................. 438/518, 438/522, 796, 902; 257/E21.09, E21.12, 257/E21.34
See application file for complete search history.

(56) References Cited

U.S. PATENT DOCUMENTS

| | | | | |
|---|---|---|---|---|
| 4,058,413 A * | 11/1977 | Welch et al. | ................... | 438/522 |
| 5,468,678 A * | 11/1995 | Nakamura et al. | ............ | 438/509 |
| 5,494,861 A * | 2/1996 | Yamaga et al. | ............... | 438/796 |
| 5,927,995 A * | 7/1999 | Chen et al. | .................... | 438/517 |
| 5,936,329 A * | 8/1999 | Shibata et al. | ................. | 310/360 |
| 6,342,748 B1 * | 1/2002 | Nakamura et al. | ......... | 310/313 A |
| 6,432,788 B1 * | 8/2002 | Maruska et al. | .............. | 438/328 |
| 7,419,892 B2 * | 9/2008 | Sheppard et al. | ............. | 438/522 |
| 7,449,345 B2 * | 11/2008 | Horng et al. | ....................... | 438/3 |
| 7,589,004 B2 * | 9/2009 | Usov et al. | ..................... | 438/510 |
| 7,642,693 B2 * | 1/2010 | Akiyama et al. | .............. | 310/311 |
| 7,678,628 B2 * | 3/2010 | Sheppard et al. | ............. | 438/172 |
| 7,709,859 B2 * | 5/2010 | Smith et al. | .................... | 257/194 |
| 7,732,301 B1 * | 6/2010 | Pinnington et al. | ........... | 438/455 |
| 7,767,509 B2 * | 8/2010 | Liu et al. | ....................... | 438/197 |
| 7,815,970 B2 * | 10/2010 | Schlesser et al. | ...... | 427/255.394 |
| 2006/0257626 A1 * | 11/2006 | Schlesser et al. | ............. | 428/141 |
| 2006/0286784 A1 * | 12/2006 | Usov et al. | ..................... | 438/515 |
| 2007/0057285 A1 * | 3/2007 | Akiyama et al. | .............. | 257/183 |
| 2007/0164315 A1 | 7/2007 | Smith et al. | | |
| 2007/0269968 A1 * | 11/2007 | Saxler et al. | ................... | 438/522 |

(Continued)

OTHER PUBLICATIONS

J.A. Fellows, et al., "Electrical and Optical Activation studies of Si-Implanted GaN," Journal of Electronic Materials, col. 34, No. 8, pp. 1107-1164 (2005).

(Continued)

*Primary Examiner* — Mary Wilczewski
(74) *Attorney, Agent, or Firm* — Lawrence E. Anderson

(57) ABSTRACT

A method of preventing the escape of nitrogen during the activation of ion implanted dopants in a Group III-nitride semiconductor compound without damaging the Group III-nitride semiconductor comprising: depositing a first layer of another Group III-nitride that acts as an adhesion layer; depositing a second layer of a Group III-nitride that acts as a mechanical supporting layer; said first and second layers forming an annealing cap to prevent the escape of the nitrogen component of the Group III-nitride semiconductor; annealing the Group III-nitride semiconductor at a temperature in the range of approximately 1100-1250° C.; and removing the first and second layers from the Group III-nitride semiconductor.

20 Claims, 8 Drawing Sheets

U.S. PATENT DOCUMENTS

| | | | |
|---|---|---|---|
| 2008/0242038 A1* | 10/2008 | Liu et al. | 438/301 |
| 2010/0123118 A1* | 5/2010 | Hu et al. | 257/13 |
| 2010/0147835 A1* | 6/2010 | Mulpuri et al. | 219/759 |
| 2010/0200954 A1* | 8/2010 | Del Agua Borniquel et al. | 257/607 |

OTHER PUBLICATIONS

J.A. Fellows, Y.K. Yeo, M.-Y. Ryu, and R. L. Hengehold, "Optical study of implantation damage recovery from Si-implanted GaN" Sol. State. Commun. 133, 213 (2005).

J.C. Zolper, J. Han, R.M. Biefeld, S.B. van Deusen, W.R. Wampler, D.J. Reiger, S.J. Pearton, J.S. Williams, H.H. Tan, R.F. Karlicek, Jr., and R.A. Stall, "Si-Implantation Activation Annealing of GaN up to 1400° C,"J. Electron. Mater. 27, 179 (1998).

K.A. Jones, P.B. Shah, K.W. Kirchner, R.T. Lareau, M.C. Wood, M.H. Ervin, R.D. Vispute, R.P. Sharma, T. Venkatesan, and O.W. Holland, "Annealing ion implanted SiC with an AlN cap," J. Mater. Sci. and Eng. B61-62, 281 (1999).

C.J. Eiting, P.A. Grudowski, R.D. Dupuis, H. Hsia, Z. Tang, D. Becher, H. Kuo, G.E. Stillman, and M. Feng, "Activation studies of low-dose Si implants in gallium nitride," Appl. Phys. Lett. 73, 3875 (1998).

J.A. Fellows, et al., "Electrical activation studies of GaN implanted with Si from low to high dose," Appl. Phys. Lett. 80, 1930 (2002).

S. Matsunaga, S.Yshida, T. Kawaji, and T. Inada, "Si Implantation in Epitaxial GaN Layers," J. Appl. Phys. vol. 95, pp. 2461-2466, Mar. 2004.

Y. Irokawa, J. Kim, F. Ren, H.H. Balk, B.P. Gila, C.R. Abernathy, S.J. Pearton, C.C. Pan, G.T. Chen, and J.I. Chyl, "Activation kinetics of implanted Si in GaN and application to fabricating lateral Schottky diodes," Appl. Phys. Lett. 83, 4987 (2003).

Y. Nakano an T. Jimbo, "Co-implantation of Si + N into GaN for n-type Doping," J. Appl. Phys. vol. 92, pp. 3815-3819, Jun. 2002.

Y. Irokawa, O. Fujishima, T. Kachi, S.J. Pearton, and F. Ren, .Electrical characteristics of GaN implanted with Si+ at elevated temperatures Appl Phys. Lett. 86, 112108 (2005).

Y. Irokawa, O. Fujishima, T. Kachi, and Y. Nakano, "Electrical activation characteristics of silicon-implanted GaN," J. Appl. Phys. 97, 83505 (2005).

R Roy, D K Agrawal, H A McKinstry "Very Low Thermal Expansion Coefficient Materials" Annual Review of Materials Science, Aug. 1989, vol. 19, pp. 59-81.

C. Kisielowski, Gallium Nitride I and II, in Semiconductors and Semimetals, vol. 57 (Academic, New York, 1998) Chap. 7, p. 276.

P.J. Burkhardt and R.F. Marvel, "Thermal expansion of sputtered silicon. nitride films," J. Electrochem. Soc., vol. 116, No. 6, pp. 864-866, Jun. 1969.

W. Qian, M. Skowronski, and G.R. Rohrer, Structural defects and their relationship to nucleation of GaN thin films. in III-Nitride, SiC, and Diamond Materials for Electronic Devices. Eds. Gaskill D.K, Brandt C.D. and Nemanich R.J., Material Research Society Symposium Proceedings, Pittsburgh, PA. 423 (1996), 475-486.

J.R. Mieham, S.J. Pearton, C.R. Abernathy, J.D. Mackenzie, R.J. Shul, and S.P. Kilcoyne,Wet chemical etching of AlN, Appl. Phys. Lett. 67, 1119 (1995).

H. Yu, L. McCarthy, H. Xing, P. Waltereit, L. Shen, S. Keller, S.P. Denbaars, J.S. Speck, and U.K. Mishra, "Dopant Activation and Ultralow Contact Resistance to Si-Ion-Implanted GaN," Appl. Phys. Lett., vol. 85, pp. 5254-5256, Nov. 2004.

E. Nogales, R.W. Martin, K.P. Connell, K. Lorenz, E. Alves, S. Ruffenach, and O. Briot, "Failure mechanism of AlN nanocaps used to protect rare earth-implanted GaN during high temperature annealing" Appl. Phys. Lett. vol. 88, 31902-31906, Jan. 2006.

X.A. Cao, C.R. Abernathy, R.K. Singh, S.J. Pearton, M. Fu, V. Sarvepalli, J.A. Sekhar, J.C. Zolper, D. J. Rieger, J. Han, T. J. Drummond, and R. J. Shul, and R. G. Wilson, "Ultrahigh Si + implant activation efficiency in GaN using a high-temperature rapid thermal process system," Appl. Phys. Lett. 73, 229 (1998).

J.A. Fellows, Y.K. Yeo, M.-Y. Ryu, and R. L. Hengehold, Sol. State. Commun. 133, 213 (2005).

H.Yu, L. McCarthy, S. Rajan, S. Keller, S. Denbaars, J. Speck, and U. Mishra, "Ion Implanted AlGaN—GaN HEMTs with Nonalloyed Contacts," IEEE Electron. Dev. Lett., vol. 26, pp. 283-285, May 2005.

J. Karpinski, J. Jun, and S. Prowski, "Equilibrium pressure of N2 over GaN and high pressure solution growth of GaN" J. Crystal Growth 66, 1 (1984).

I. Yonenaga, J. Condens. "High-temperature strength of III—V nitride crystalsHigh-temperature strength of III—V nitride crystals" Matter 14, 12947 (2002).

I. Yonenaga and K. Motoki, "Yield strength and dislocation mobility in plastically deformed bulk single-crystal GaNJ," Appl. Phys. 90, 6539 (2001).

W. Qian, G.S. Rohrer, M. Skowronski, K. Doverspike, L.B. Rowland, and D.K. Gaskill, Open-core screw dislocations in GaN epilayers observed by scanning force microscopy and high-resolution transmission electron microscopy, Appl. Phys. Lett. 67, 2284 (1995).

S.K. Hong, T. Yao, B.J. Kim, S.Y. Yoon, and T.I. Kim, "Origin of hexagonal-shaped etch pits formed in (0001) GaN films," Appl. Phys. Lett. 77, 82 (2000).

E. Bellet-Amalric, C. Adelmann, E. Sariannidou, J.L. Rouviere, B. Feuillet, E. Monroy, and B. Daudin, "Plastic strain relaxation of nitride heterostructures," J. Appl. Phys. 95, 1127 (2004).

W. Gotz, N. M. Johnson, C. Chen, H. Liu, c. Kuo, and W. Imier, "Activation energies of Si donors in GaN," Appl. Phys. Lett. 68, 3144 (1996).

H.M. Ng, D. Doppalapudi, T.D. Moustakis, N.G. Weimann, L.F. Eastman,"The role of dislocation scattering in n-type GaN films," Appl. Phys. Lett. 73, 821 (1998).

S. Nakamura, T. Mukai, and M. Senoh, "In situ monitoring and Hall measurements of GaN grown with GaN buffer layers," J. Appl. Phys. 71, 5543 (1992).

P. Boguslawski, et al. "Native defects in gallium nitride," Phys. Rev. B 51, 17255-17258 (1995).

J.A. Fellows, et al., "Electrical activation studies of GaN implanted with Si from low to high dose," Appl. Phys. Lett. 80, 1930 (2002).

K.A. Jones, M.A. Derenge, K.W. Kirchner, M.N. Ervin, M.C. Wood, T.S. Zheleva et al."Properties of annealed AlN films deposited by pulsed laser deposition," J. Electron. Mater. 29 (2000), p. 262.

R.V. Ravi and G.J. Varker, "Oxidation-induced stacking faults in silicon. I. Nucleation phenomenon," J. Appl. Phys. 45 263 (1974).

* cited by examiner

SEM micrograph of a 200 nm thick PLD deposited AlN film annealed for 30 min at 1100°C.

SEM micrograph of a 80 nm thick AlN film grown epitaxially on GaN at 1100°C.

SEM micrograph of a dual AlN cap annealed for 30 min @ (A) 1100, (B) 1150, (C) 1200, (D) 1250, and (E) 1300°C.

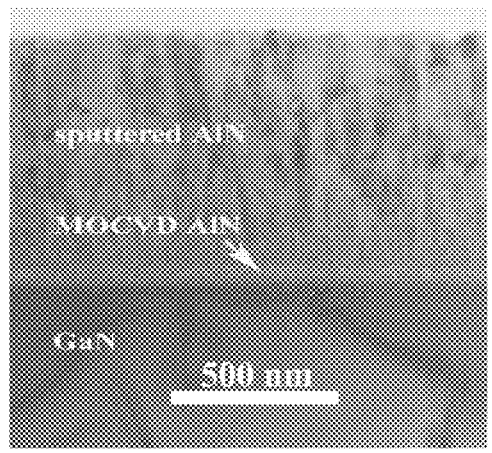 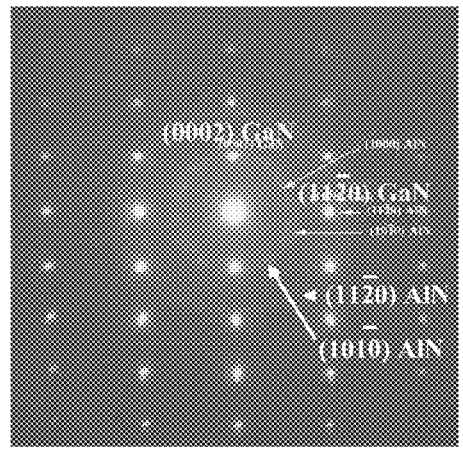
FIGURE 4A.　　　　　　　　FIGURE 4B
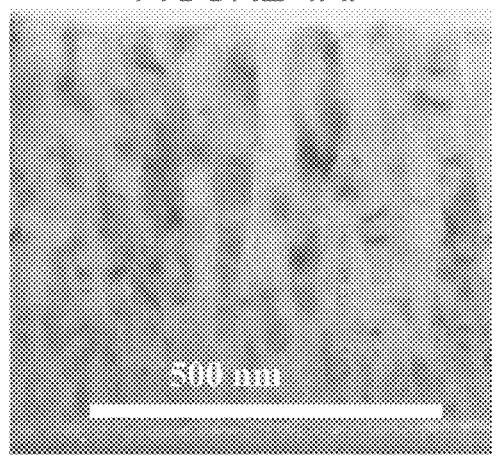 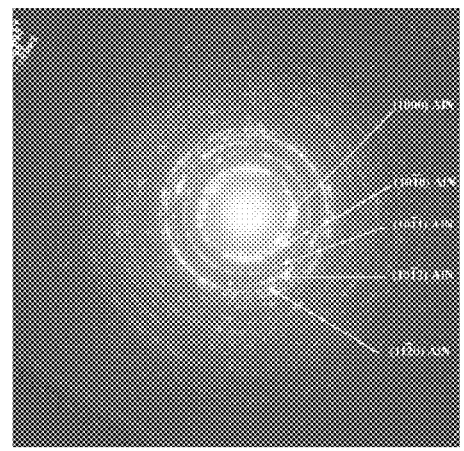
FIGURE 4C　　　　　　　　FIGURE 4D
Cross section TEMs of the
(A) the low temperature adhesion layer
(B) its associated SAD pattern
(C) sputtered AlN portion of the cap
and (D) its associated SAD pattern,
for a sample annealed for 30 min at 1250°C.

SEM micrographs of the GaN surface with the cap layers etched off of the sample that was implanted to $5 \times 10^{17}$ cm$^{-3}$ and (A) was not annealed, and was annealed at (B) 1100, (C) 1200 or (D) 1250°C.

5 x 5 μm AFM micrographs of the GaN surface with the cap layers etched off of the sample that was implanted to 5 x $10^{17}$ cm$^{-3}$ and (A) was not annealed, and was annealed at (B) 1100, (C) 1200 or (D) 1250°C.

TEM IMAGES TAKEN BEFORE
(7A) AND AFTER (7B) ANNEALING

Net donor concentration and electron mobility for samples annealed for 30 min at 1100, 1150, 1200 and 1250°C for Si box implantation concentrations of (A) $5 \times 10^{17}$ and (B) $1 \times 10^{19}$ cm$^{-3}$

METHOD USING MULTIPLE LAYER ANNEALING CAP FOR FABRICATING GROUP III-NITRIDE SEMICONDUCTOR DEVICE STRUCTURES AND DEVICES FORMED THEREBY

STATEMENT OF GOVERNMENT INTEREST

The invention described herein may be manufactured, used, and licensed by or for the United States Government.

FIELD OF INVENTION

This invention relates broadly to semiconductor devices and semiconductor device fabrication and in particular to methods for doping semiconductor layers, materials, or components.

BACKGROUND OF THE INVENTION

As is well known to those of ordinary skill in the art, annealing is a heat treatment process wherein a material is heated to a suitable temperature for a period of time, and then cooled. In the semiconductor industry, wafer materials, such as silicon, are annealed, so that dopant atoms, such as boron, phosphorus or arsenic, etc., can diffuse into substitutional positions in the crystal lattice, resulting in changes in the electrical properties of the semiconducting material.

The introduction of dopants in a semiconductor is commonly achieved by ion implantation. Dopant ions such as boron, phosphorus or arsenic, etc, are generally created from a gas source. When implanted in a semiconductor, each dopant atom can create a charge carrier in the semiconductor (hole or electron, depending on if it is a p-type or n-type dopant), thus modifying the conductivity of the semiconductor in its vicinity.

Semiconductor devices made from silicon or other semiconductor materials are routinely made with ion implantation because they can be made with planar technology. Ohmic contacts with a lower contact resistance can be fabricated, and the doping concentration and profiles can be more closely controlled. The dopants can be electrically activated routinely by heating the silicon (or other semiconductor material) in a non-oxidizing atmosphere to a temperature of roughly 1000° C. Being able to ion implant dopants has many advantages such as enabling more planar technology and lowering the contact resistance. Implantation activation in the III-V semiconductors such as gallium arsenide (GaAs) or gallium nitride (GaN) is more difficult than with elemental semiconductor materials because the group V element; e.g., arsenic or nitrogen, has a relatively large vapor pressure, and it will evaporate preferentially at the temperatures required to activate the implants. If left unprotected during the activation anneal, the device structure will be destroyed or significantly degraded. This problem has been solved for GaAs by depositing a silicon nitride ($Si_3N_4$) layer that acts as an annealing cap for the annealing temperatures of 800-900° C. and prevents the arsenic (As) from escaping. The deposited layer can then be preferentially etched off of the GaAs with hydrofluoric acid without attacking the GaAs. This problem has also been solved for SiC using a graphite or AlN/BN annealing cap to prevent the preferential evaporation of silicon.

$Si_3N_4$ and $SiO_2$ annealing caps for GaN have had only mixed success because they do not adhere well and can be punctured or blown off by the large nitrogen partial pressure that exists at the temperature required for activation. GaN cannot be routinely implanted because the nitrogen evaporates preferentially at the temperatures required to activate the implanted dopants. $Si_3N_4$, cannot be used as an annealing cap for GaN because (a) higher activation temperatures are required (>1200° C.), (b) it does not adhere well to GaN, and (c) it cannot withstand the higher N pressures, as blow holes can form in $Si_3N_4$ annealing cap.

Likewise, sputtered or pulsed laser deposition (PLD) deposited AlN films have had mixed success because they do not adhere to the GaN surface making it possible for the nitrogen to escape at the elevated temperatures. Researchers have also attempted to rapid thermal anneal (RTA) their samples in the hope that the kinetics for the evaporation of N would be too slow for it to respond, but considerable topological damage is created. Annealing under an $N_2$ pressure that exceeds the partial pressure of $N_2$ in equilibrium with GaN is also extremely challenging given that the partial pressure is approximately 100 MPa at 1500 degrees K.

The single sputtered AlN film disclosed in the publication by J. C. Zolper, et al., J. Electron. Mater. 27, 179 (1998) does not adhere well, and it contains pores through which the N from the GaN can escape. As used herein, sputtering is a process whereby atoms are ejected from a solid target material due to bombardment of the target by energetic ions. As used herein, sputter deposition is a physical vapor deposition (PVD) method of depositing thin films by sputtering, i.e. ejecting, material from a "target," i.e., source, which then deposits onto a substrate or layer.

The PLD deposited AlN film disclosed in K. A. Jones, et al., J. Mater. Sci. and Eng. B61-62, 281 (1999) (hereby incorporated by reference) did not adhere sufficiently as well, as is shown in FIG. 1A. Epitaxial AlN films grown by metal organic chemical vapor deposition (MOCVD) or molecular beam epitaxy (MBE) adhere better, but they crack due to the lattice mismatch between the GaN and AlN as shown in FIG. 1B. The single epitaxial AlN film grown at the normal growth temperature for AlN films (approximately 1100° C.) as disclosed in the publication by C. J. Eiting, et al, Appl. Phys. Lett. 73, 3875 (1998), did not provide good coverage because it cracked since it was not sufficiently pliable and because it does not have the strain relief mechanisms that a low temperature AlN film provides. The single AlN film deposited at low temperature by molecular beam epitaxy (MBE) disclosed by J. A. Fellows, et al., Appl. Phys. Lett. 80, 1930 (2002) is not strong enough to withstand the relatively large N pressures from the GaN.

Accordingly, there exists a need for an annealing cap that has better adherence, that is mechanically stronger and still capable of completely covering the sample, that is stable at temperatures in excess of 1200° C., and that is capable of being selectively etched off at the end of the anneal.

BRIEF SUMMARY OF THE INVENTION

A preferred embodiment of the present invention utilizes an annealing cap formed by the lower temperature (approximately 600° C.) deposition of a thin (in the range of approximately 30 to 130 nm) aluminum nitride (AlN) film as a pliable adhesion layer, and a thicker (at least one half micron) polycrystalline AlN film to give the cap sufficient strength to withstand the large N pressure, as illustrated in FIG. 2. It is thermally stable at the predetermined annealing temperatures, and it can be selectively "etched off" with warm potassium hydroxide (KOH) after the anneal procedure has been completed. The advantages of an annealing cap constructed in accordance with the principles of the present invention include providing complete coverage; the annealing cap does not have pores that penetrate to the GaN surface; the cap adheres better so that decomposition of the GaN does not occur around the edges, and the thicker sputtered or pulse laser deposited polycrystalline film gives the annealing cap greater mechanical strength to better withstand the relatively high N pressures.

BRIEF DESCRIPTION OF THE DRAWINGS

FIGS. 4A through 4D are cross section of an image obtained by transmission electron microscopy (TEM) of the (A) low temperature adhesion layer and (B) its associated SAD pattern and (C) sputtered AlN portion of the cap and (D) its associated SAD pattern for a sample annealed for 30 minutes at 1250° C.

DETAILED DESCRIPTION OF THE INVENTION

Figure 1A:
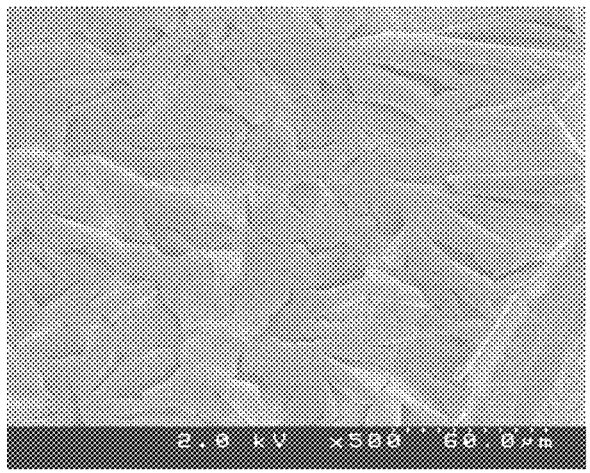
FIG. 1A illustrates a micrograph of a pulsed laser deposited (PLD) AlN film on a GaN substrate.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention may be particularly well suited for use in nitride-based devices such as Group III-nitride based HEMTs. As used herein, the term "Group III nitride" refers to those semiconducting compounds formed between nitrogen and the elements in Group III of the periodic table, usually aluminum (Al), gallium (Ga), and/or indium (In). As used herein, the terminology Group III-N also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. For example, the formula $Al_xGa_{1-x}N$ where $0 \leq x < 1$ is descriptive of a ternary compound, where one mole of nitrogen is combined with a total of one mole of the Group III elements. Likewise, the terminology x=0 when used in conjunction with the formula $Al_xGa_{1-x}N$ indicates that the layer or semiconductor material is GaN; and when x=1, the layer or semiconductor material is AlN. Those of ordinary skill in the art can readily appreciate that the terminology "Group III-N" or "Group III-nitride" in conjunction with a layer or semiconductor material as used herein may also encompass other Group III-nitrides such as InGaN, AlInGaN or the like. It is noted that diamond like nitrides of aluminum, gallium and indium have similar characteristics in that all have the wurtzite structure in which each atom occupies tetrahedral sites. For example, generally speaking in aluminum nitride, each aluminum atom has four neighboring nitrogen atoms at the corners of a tetrahedron and similarly each nitrogen atom has four neighboring aluminum atoms at the corners of a tetrahedron.

A preferred embodiment of the present invention is an annealing cap composed of preferable an 80 nm AlN layer (in the range of 30 to 130 nm) deposited by MOCVD at a temperature in the range of 450 to 650° C. and a thicker layer (at least one half micron) deposited at approximately 500° C. The 500° C. temperature is not critical; however, the density generally increases with temperature. The first layer gives the cap good adhesion and complete coverage, while the thicker layer gives it strength. It can withstand annealing temperatures of 1250° C. for at least 30 minutes, which is near the temperature of 1285° C. where the $N_2$ partial pressure equals the yield strength of AlN, −300 MPa. This is demonstrated in FIG. 3 where scanning electron microscope (SEM) micrographs of the annealing cap after 30 min anneals at 1100, 1150, 1200, 1250, and 1300° C. are displayed.

Figure 2:
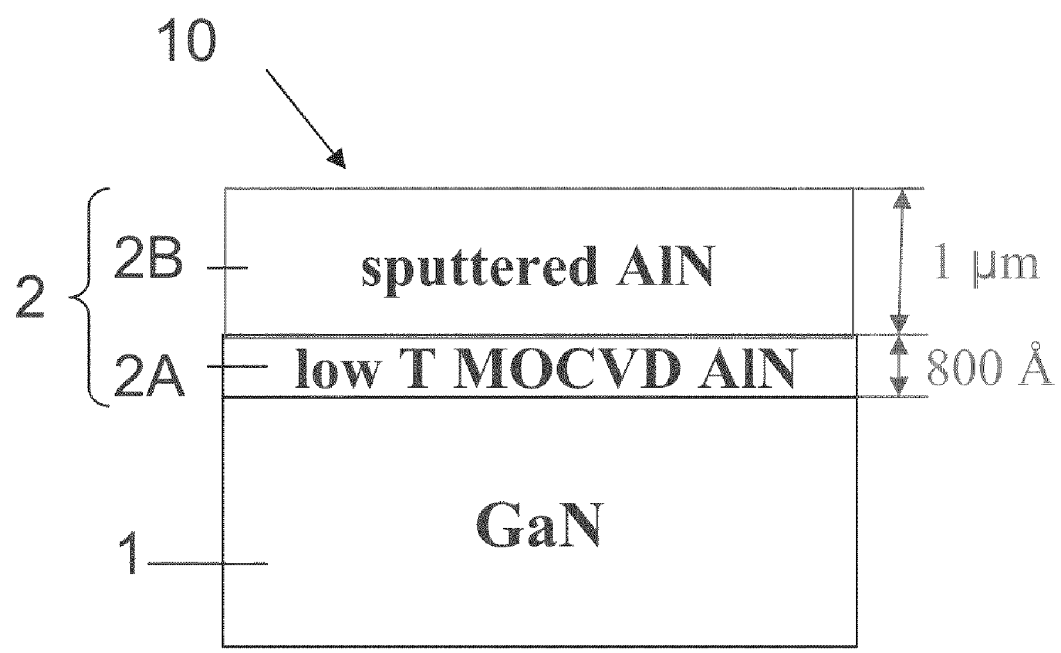
FIG. 2 is schematic diagram of a preferred embodiment annealing cap of the present invention.
Figure 3A:
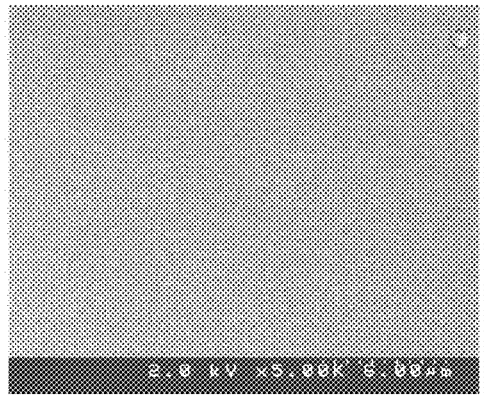
FIGS. 3A through E are SEM micrographs of the AlN annealing cap annealed for 30 minutes at (A) 1100, (B) 1150, (C) 1200, (D) 1250 and (E) 1300° C.
Figure 3B:
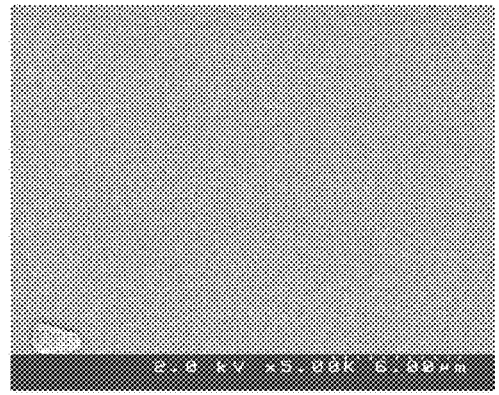
Figure 3C:
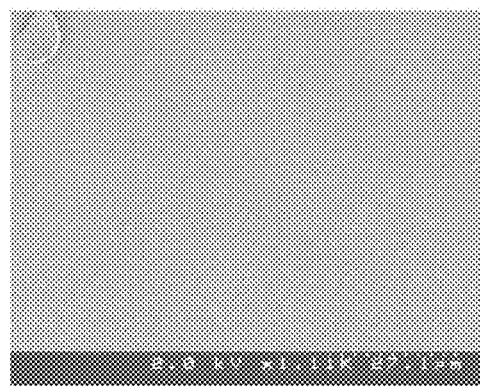
Figure 3D:
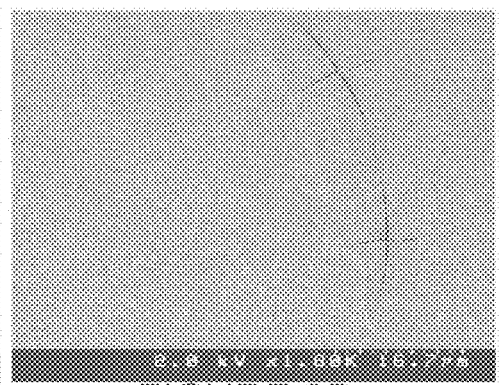
Figure 3E:
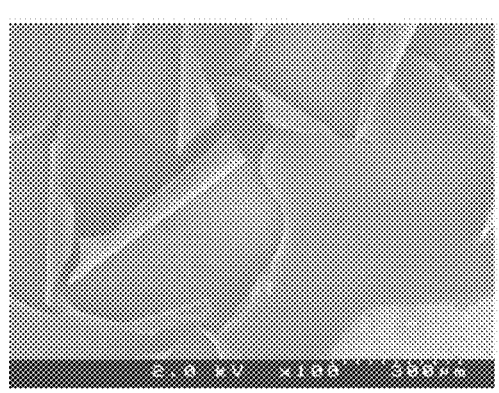
Figure 5A:
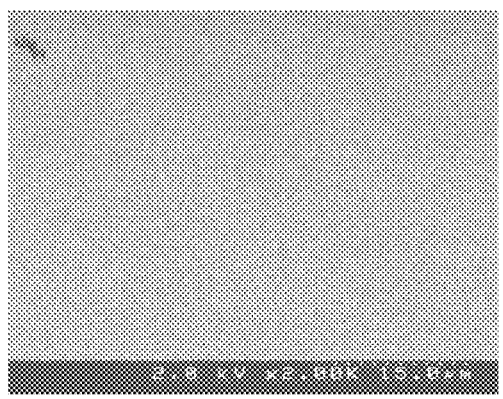
FIGS. 5A through 5D are SEM micrographs of the GaN surface with cap layers etched off of the sample that were implanted to $5 \times 10^{17}$ cm$^{-3}$ and (A) was not annealed, or was annealed at (B) 1100 (C)1200 or (D) 1250 degrees Centigrade.
Figure 5B:
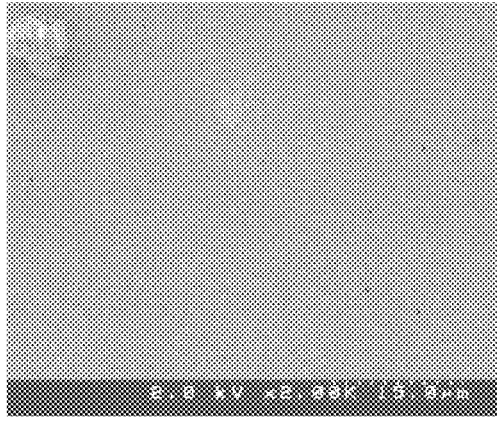
Figure 5C:
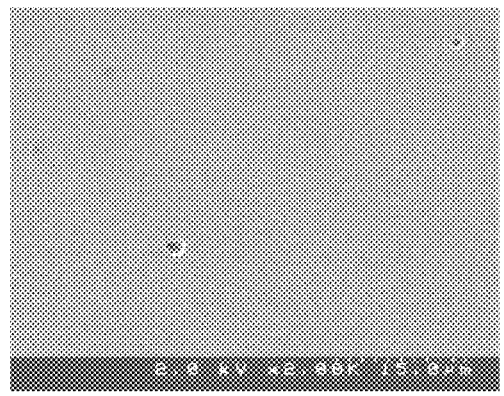
Figure 5D:
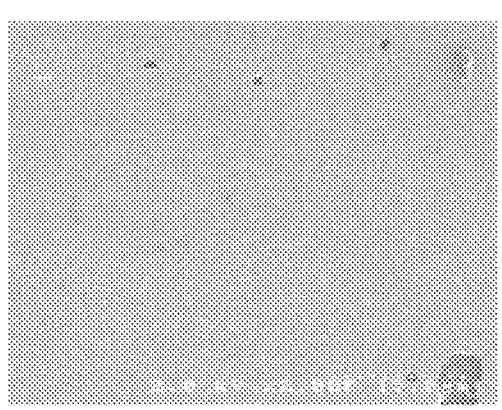
Figure 6A:
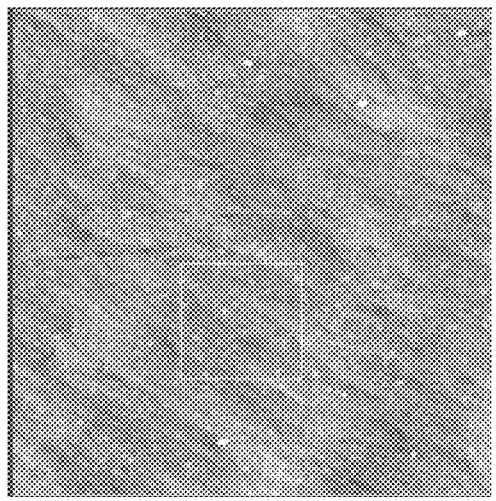
FIGS. 6A through 6D are 5×5 AFM micrographs of the GaN surface with the cap layers etched off of the sample that was implanted to $5 \times 10^{17}$ cm$^{-3}$ and (A) was not annealed, and was annealed at (B) 1100, (C) 1200 or (D) 1250° C.
Figure 6B:
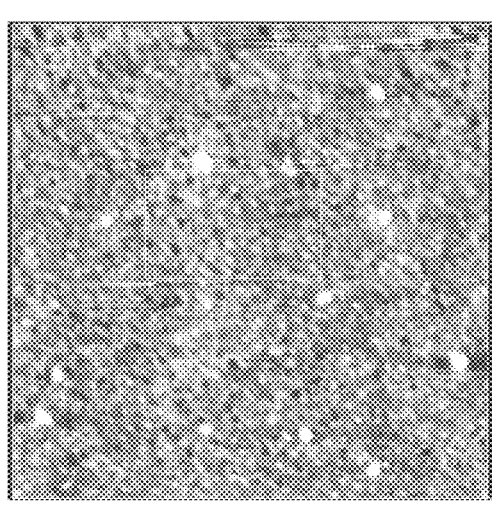
Figure 6C:
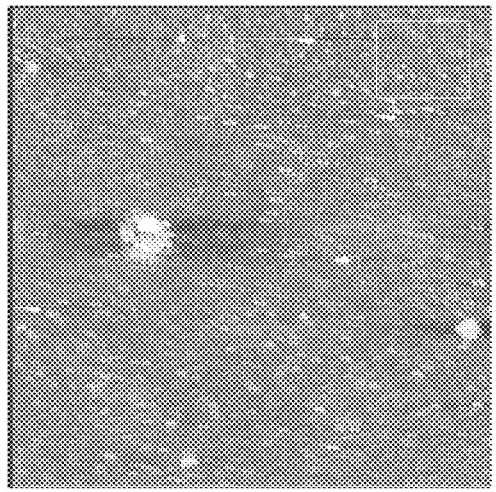
Figure 6D:
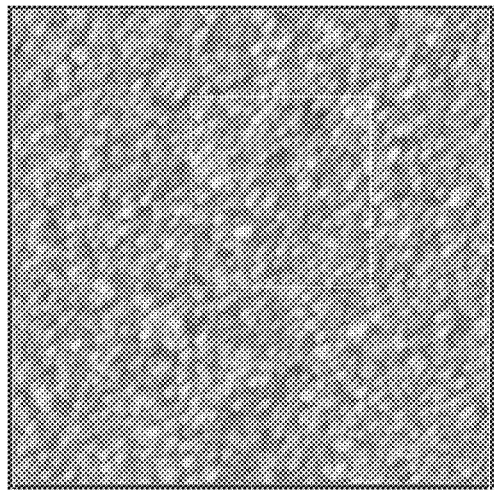

Compounds with properties similar to AlN can be used to practice the principles of the invention. Generally speaking, the annealing cap of the present invention comprises the formation of two separate layers; a first adhesion layer or cap formed of a compound which adheres to the GaN and a second layer that provides good mechanical strength. FIG. 2 is a schematic illustration of a preferred embodiment of the present invention showing a semiconductor configuration or assembly 10 comprising a galium nitride semiconductor layer or base (1), having thereon an annealing cap 2 comprising a first adherence layer 2A comprising AlN and a thicker layer 2B which provides mechanical strength and also comprises AlN. The term "cap" as used herein may be in the form of a layer and is not meant to imply any particular shape or form as the term "cap" as used herein may be of a variety of shapes and forms, including circular, rectangular, square, etc. Although a substantially constant thickness is depicted in FIG. 2, the thickness or cross section may also vary from one end of the cap to another. Inasmuch as the same compound (in the preferred embodiment AlN) may be used to form both the adhesion layer and the mechanical strength layer, coalescence may take place to transform the two layers into one without departing from the scope of the present invention. Similarly, multiple layers (in excess of two) could be used without departing from the scope of the present invention.

With respect to the adhesion layer; i.e., the low temperature (approximately 600° C.) AlN layer deposited by MOCVD that is used primarily for adhesion, a material that can adhere to the GaN surface may be substituted for AlN without departing from the principles of the present invention. For example, a material such as AlGaN could be utilized provided that the percentage of gallium is such that the AlGaN composition is different enough from the gallium nitride layer upon which it is deposited so that it may layer be selectively etched off or otherwise removed. Likewise, impurities may be present in the AlN which do not impact the adherence properties without departing from the scope of the present invention. The AlN adhesion layer is described in the preferred embodiment as being epitaxial AlN films grown by MOCVD. However, other epitaxial processes, such molecular beam epitaxy or other methods which provide enhanced adherence may be utilized without departing from the scope of the present invention. The term epitaxy as used herein encompasses varieties of epitaxy such as heteroepitaxy, a kind of epitaxy performed where a crystalline film grows on a crystalline substrate or film of another material. Such technology is often applied to growing crystalline films of materials of which single crystals cannot be obtained and to fabricating integrated crystalline layers of different materials.

With respect to the thicker (approximately one half micron or more) sputtered AlN film provided to give the cap sufficient strength to withstand the large N pressure, nitrides other than AlN may be utilized that have sufficiently strength characteristics without departing from the scope of the present invention. Generally speaking, silicon nitride and gallium arsenide are not as strong as AlN and hence, not as desirable as AlN. The thicker, sputtered AlN layer is used primarily for strength and because it won't decompose at the annealing temperatures used that could cause evaporation of the cap. Also, AlN is not attacked chemically by the nitrogen or argon gases that are typically used in an annealing furnace. However, any material that would not evaporate or be chemically attacked at these annealing temperatures could be used instead of the AlN; e.g., high melting points oxides, carbides and nitrides which are sufficiently strong, and which can also be etched off. Tantalum nitride and titanium nitride possess the requisite strength characteristics but may prove to be more challenging than AlN with respect to adhesion qualities.

Transmission Electron Microscope (TEM) micrographs and their associated selective area diffraction (SAD) patterns in FIG. 4 show that the adhesion layer is tightly and continuously bound to the GaN, and the sputtered layer is composed of somewhat randomly oriented long, thin grains. SEM micrographs of the GaN surface after the cap has been removed with a KOH etch shown in FIG. 5 for films annealed at 1100, 1150, 1200, and 1250° C. for 30 min show that there is no evidence for the preferential evaporation of N that is often represented by the formation of a large number of hexagonally shaped thermal etch pits. Atomic force microscope (AFM) micrographs of the same surface in FIG. 6 show that there are small, but detectable differences in the structure of the annealed samples probably due to solid state diffusion.

With an $\alpha_T$ of $4.15\times10^{-6}/K^9$, AlN is quite compatible with the GaN, and it is also stronger and has a lower evaporation rate at a given temperature than $SiO_2$ or $Si_3N_4$. Having the same crystal structure, it also has the potential to adhere better, and it can also be selectively etched off. See J. R. Mieham, et al., Appl. Phys. Lett. 67, 1119 (1995). AlN caps have been deposited by sputtering (see J. R. Mieham, et al; J. C. Zolper, et al.; and H. Yu, et al, Appl. Phys. Lett. 85, 5254 (2004)) and by metal organic chemical vapor deposition (MOCVD) (see C. J. Eiting, et al., E. Nogales, et al., Appl. Phys. Lett. 88, 31902 (2006) and X. A. Cao, et al. Appl. Phys. Lett. 73, 229 (1998)) or molecular beam epitaxy (MBE).(see J. A. Fellows, et al., Appl. Phys. Lett. 80, 1930 (2002); and J. A. Fellows, et al., Sol. State. Commun. 133, 213 (2005)).

Figure 1B:
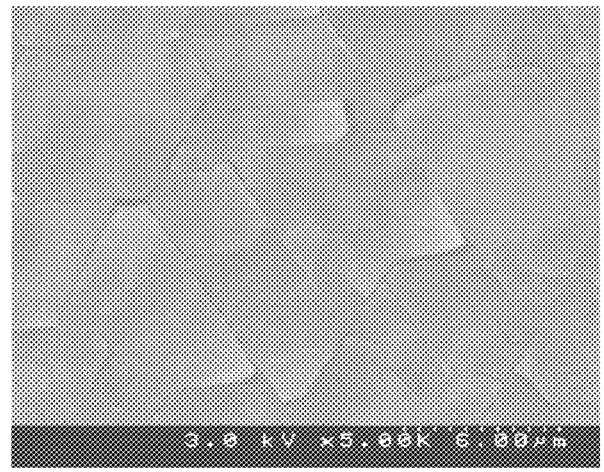
FIG. 1B illustrates strains produced by the epitaxial growth process due to the relatively large lattice mismatch (2.4%), so a large number of cracks are formed in the AlN cap.

The MOCVD films have been grown at the normal epitaxial growth temperature of ~1100° C. either in situ before (see C. J. Eiting, et al., and E. Nogales, et al.,) or after (see X. A. Cao, et al.,) the ion implantation. The MBE films were deposited in situ at 100° C., and the Si ions were implanted through them. FIGS. 1A and 1B show SEM micrographs of a (a) 200 nm thick PLD deposited AlN film annealed for 30 min at 1100° C., and (b) 80 nm thick AlN film grown epitaxially on GaN at 1100° C., respectively.

FIG. 1A is an SEM micrograph of a 200 nm thick pulsed laser deposited (PLD) AlN film annealed for thirty minutes at 1100° C. As shown in FIG. 1A, the PLD AlN that successfully worked well for capping implanted SiC samples (see, e.g., K. A. Jones, et al) did not work for GaN; as one can see there is considerable evaporation at the edges, which is due to poor adhesion. In order to obtain better adhesion, a thin (80 nm) AlN cap was epitaxially grown on the GaN film at 1100° C. before removing it from the MOCVD growth reactor. As shown in FIG. 1B, strains produced by the epitaxial growth process are too large due to the relatively large lattice mismatch (2.4%), so a large number of cracks are formed in the AlN cap.

To obtain an AlN cap that had good adhesion, an AlN layer was deposited at the same temperature as the deposited GaN nucleation layer when GaN films are grown, i.e., 600° C. Note that the temperature of 600° C. is approximated and that temperatures at or near 600° C. may be utilized to achieve similar results without departing from the principles of the present invention.

To strengthen this cap, a 1 μm AlN film was sputter deposited on top of this low temperature (LT) layer. It can readily be appreciated by those of ordinary skill in the art that the dimensions of the sputter deposited layer are approximate and that the thickness may vary without departing from the principles of the present invention. Moreover, techniques other than sputtering may be used to achieve the desired strengthening qualities obtained by the sputtering technique as is readily appreciated by those of ordinary skill in the art.

FIGS. 3 and 4 illustrate the properties of this 'dual' cap both before and after the sample is annealed. FIGS. 5 and 6 reveal the surface of the GaN film after the cap has been selectively etched off using SEM and AFM microscopy.

Figure 7A:
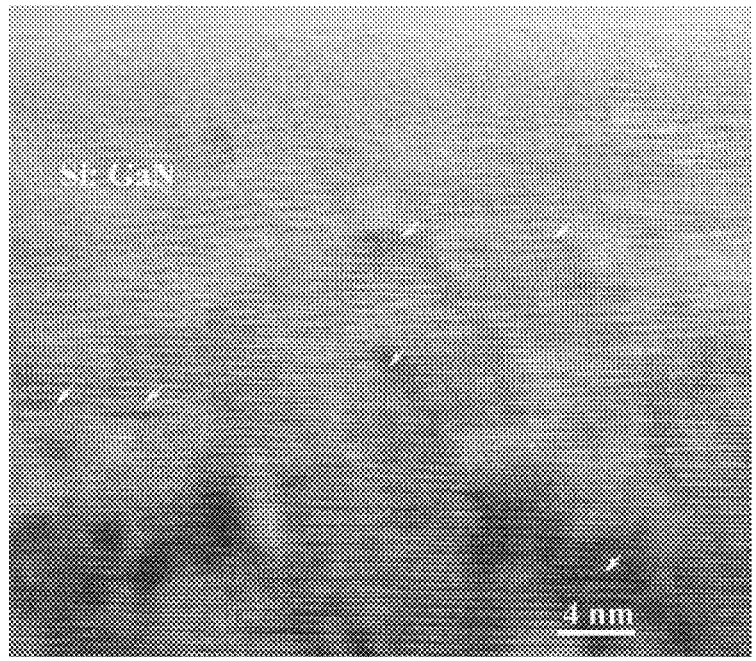
FIG. 7 is a cross sectional image obtained by high-resolution transmission electron microscopy (HRTEM) of samples that were implanted to $10^{19}$ cm$^{-3}$ (a) before and (b) after a 1250 degree anneal for 30 minutes.
Figure 7B:
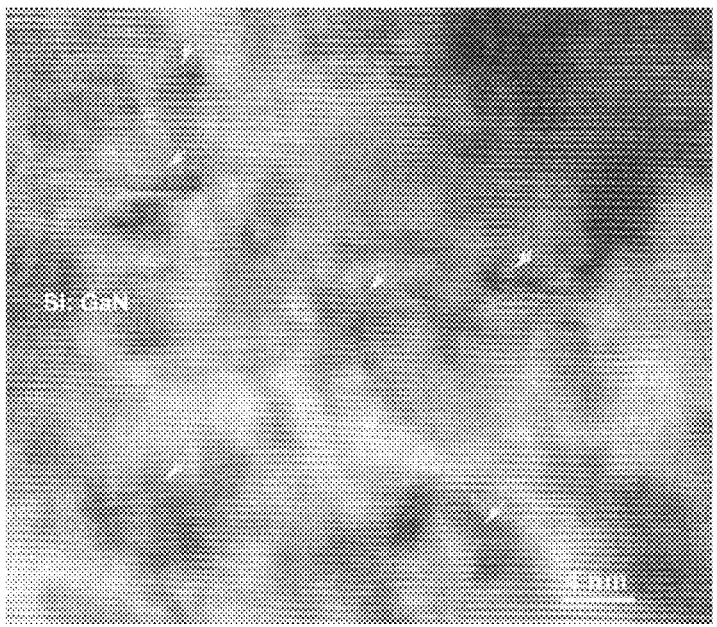

As shown in FIG. 7, the TEM has been used to examine the implant damage before and after the anneal, as well as the substrate/cap interface. As shown in FIG. 8, the activation of the implants is studied by measuring the transport properties of the annealed samples subjected to different activation annealing temperatures, $T_A$, using a Hall effect and van der Pauw system. (see H. Yu, et al., IEEE Electron. Dev. Lett. 26, 283 (2005)).

Experimental Procedure

Undoped GaN films were grown on sapphire substrates by MOCVD to a thickness of ~2 μm, and then they were box implanted with Si to a concentration of $5\times10^{17}$ or $1\times10^{19}$ $cm^{-3}$ using the following program shown in Table 1, as determined by TRIM calculations. Table 1 reveals the accelerating voltages and the doses used for implanting the Si.

| Acceler. | Dose | |
|---|---|---|
| Voltage (kV) | $5 \times 10^{17}$ ($cm^{-2}$) | $1 \times 10^{19}$ |
| 25 | $0.65 \times 10^{12}$ | $0.13 \times 10^{14}$ |
| 54 | $1.15 \times 10^{12}$ | $0.23 \times 10^{14}$ |
| 116 | $3.30 \times 10^{12}$ | $0.66 \times 10^{14}$ |
| 250 | $9.90 \times 10^{12}$ | $1.98 \times 10^{14}$ |

Following the implant, the wafers were cleaned, and an 80 nm AlN film was grown on them by MOCVD at 600° C. This thin adhesion layer was then capped with a 1 μm AlN film that was sputter deposited at 500° C. The 50 mm wafer was diced into samples ~1 cm on a side, which were annealed for 30 min in an RF heated furnace under an $N_2$ atmosphere at a pressure of 400 Torr. After removing the samples from the furnace, the cap topology was examined with an SEM and AFM. TEM cross sections were taken of an as-deposited cap and one that was annealed at 1250° C. High resolution TEM (HRTEM) cross sections were also taken of the implanted GaN before and after an anneal at 1250° C. Samples were prepared for Hall measurements by forming ohmic contacts using a 100/1000/500/200 Å stack of Ti/Al/Ni/Au annealed at 800° C. for 30 seconds.

SEM micrographs of the cap surface of the implanted samples annealed at 1100, 1150, 1200, 1250, and 1300° C. are shown in FIG. 3 where it is seen that there is no disruption in the surface until the annealing temperature reaches 1250° C. where a few cracks can be seen, and the cap is virtually destroyed after the 1300° C. anneal. The probable cause for the destruction of the cap is the nitrogen escaping from the GaN—it could simply have blown the AlN cap off, or in escaping it left gallium behind that reacted with the AlN. In the pressure regime below 1000 bar the $N_2$ partial pressure, $P_{N2}$, in equilibrium with GaN has a simple exponential relationship because it behaves like an ideal gas, and it is given by the equation $$P_{N2}=8.927\times10^{13}e^{-37,026/T}$$

where $P_{N2}$ is given in bars and T is in ° K.

Using the above equation, the temperature at which $P_{N2}$=1000 bar (100 MPa), the yield stress of GaN at 1000° C.[21], is 1195°; the temperature at which it would equal 125 MPa, the fracture stress of GaN at 1000° C., is 1210° C. Since the partial pressure curve begins to deviate from the exponential relationship at ~100 bar, 25° C. could be added to these two temperatures. The highest temperature that the annealing cap could withstand is ~1250° C., which is probably the highest temperature that any AlN cap can withstand because it has reached its theoretical limit.

FIG. 4 shows the cross section TEM of the (a) the low temperature adhesion layer and (b) its associated SAD pattern and (c) sputtered AlN portion of the cap and (d) its associated SAD pattern, for a sample annealed for 30 min at 1250° C. It demonstrates that the cap has good adhesion and probably has not been mechanically punctured or broken as no evidence of voids being formed at the GaN/AlN interface or in the LT-MOCVD AlN were discovered. The sputtered AlN is composed of long, acicular grains ~50 nm in diameter, and it contains a few voids. If this were the only film, the voids could provide a path for escape of the N, but these paths are blocked off by the LT-MOCVD layer. It is not likely the voids would have much effect on the strength of the film because there are relatively few of them.

The SEM micrographs of the surface of the GaN after the cap has been etched off are shown in FIG. 5. Specifically, FIG. 5 shows the GaN surface with the cap layers etched off of the sample that was implanted to $5 \times 10^{17}$ cm$^{-3}$ and (a) was not annealed, and was annealed at (b) 1100, (c) 1200 or (d) 1250° C. The only changes one sees is that a few hexagonal pits are formed when the samples are annealed, and that they increase in size as $T_A$ increases. These pits are probably thermal etch pits formed at micropipes[23] as is described in S. K. Hong, et al., Appl. Phys. Lett. 77, 82 (2000). There is no evidence that larger pits were formed due to the preferential evaporation of nitrogen.

FIG. 6 shows 5×5 μm AFM micrographs of the GaN surface with the cap layers etched off of the sample that was implanted to $5 \times 10^{17}$ cm$^{-3}$ and (a) was not annealed, and was annealed at (b) 1100, (c) 1200 or (d) 1250° C. The GaN surface before and after the anneal do not show hexagonal pits or gallium droplets that accompany nitrogen evaporation. The sample implanted to $5 \times 10^{17}$ cm$^{-3}$ and not annealed shown in FIG. 5a has a smooth surface with wavy lines[3], and it has an rms roughness of 0.362 nm. The sample implanted to the same level and annealed at 1100° C. is rougher with an rms roughness of 1.235 nm, the roughness of the sample annealed at 1200° C. is larger yet with an rms roughness of 2.493 nm, and the sample annealed at 1250° C. is the roughest with an rms value of 3.965 nm. The GaN crystallites have been more clearly defined by surface diffusion during the anneal, as the size of the surface features, ~150 nm, is about the same size as the grains. It is, however, possible that the GaN surface has been etched by the KOH etch used to remove the AlN cap by preferentially attacking the grain boundaries, but this does not seem to be as likely an explanation because one would expect that dislocation etch pits would appear, and they do not.

Most of the activation annealing studies done by others in the prior art do not address the issue of surface damage to the GaN layer, but those that do, did not anneal their samples at temperatures higher than 1300° C., and they all observed some surface damage. Using a 140 nm $Si_3N_4$ cap, it was noted in Matsunaga et al., J. Appl. Phys. 95, 2461 (2004). that hexagonal pits were formed in the surface of the GaN when they RTA annealed the sample to 1200° C. The pits were probably formed because the $Si_3N_4$ did not adhere well to the surface or that holes were formed in it when hydrogen, a by product of the sputtering process, was boiled off. Using a 500 nm $SiO_2$ annealing cap, Y. Nakano and T. Jimbo, J. Appl. Phys. 92, 3815 (2002), observed gallium droplets on the surface of the GaN when they furnace annealed the sample for 5 min at 1300° C. This is likely due to the relatively poor adhesion of the $SiO_2$, which was sputtered deposited at room temperature, even if it was strong enough to withstand the force produced by the large partial pressure of $N_2$. As noted in C. J. Eiting, et al. there was decomposition of the GaN beneath the cracks in the 50 nm thick, MOCVD grown AlN cap, and the surface roughness increased with the annealing time when the sample was annealed at 1150° C. Cracks were created in the AlN because it has a 2.4% lattice mismatch with GaN, and it is much thicker than its critical thickness of 1-3 nm. See E. Bellet-Amalric, et al, J. Appl. Phys. 95, 1127 (2004). Even when the epitaxially grown AlN was only tens of nm thick, it cracked, as E. Nogales, et al, demonstrated, and damage occurred beneath the cracks when the sample was annealed at 1200° C.

Shown in FIG. 7 are cross section HRTEM micrographs of samples that were implanted to $10^{19}$ cm$^{-3}$ with Si (a) before and (b) after a 1250° C. anneal for 30 min Although it is difficult to discern in the HRTEM micrographs in FIG. 6 because of all of the dislocations that the GaN film contains, one can still see that the stacking faults are larger in the sample annealed at 1250° C. than they are in the unannealed sample.

Figure 8A:
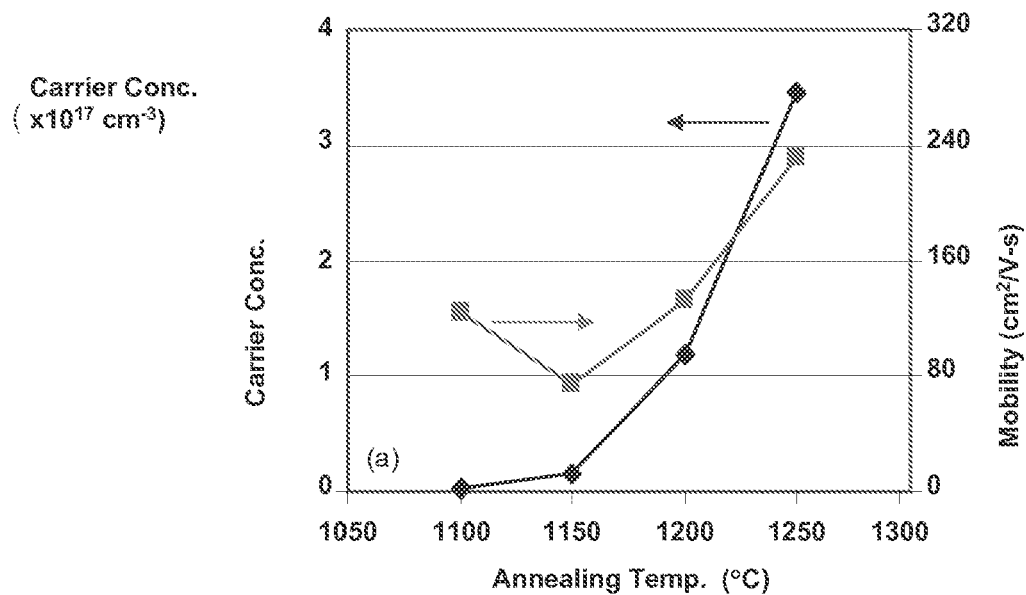
FIGS. 8A and 8B are graphical illustrations of the net donor concentration and electron mobility for samples annealed for 30 minutes at 1100, 1150, 1200 and 1250 degrees Centigrade for Si box implantation concentrations of (a) $5 \times 10^{17}$ and (B) $1 \times 10^{19}$ cm$^{-3}$.
Figure 8B:
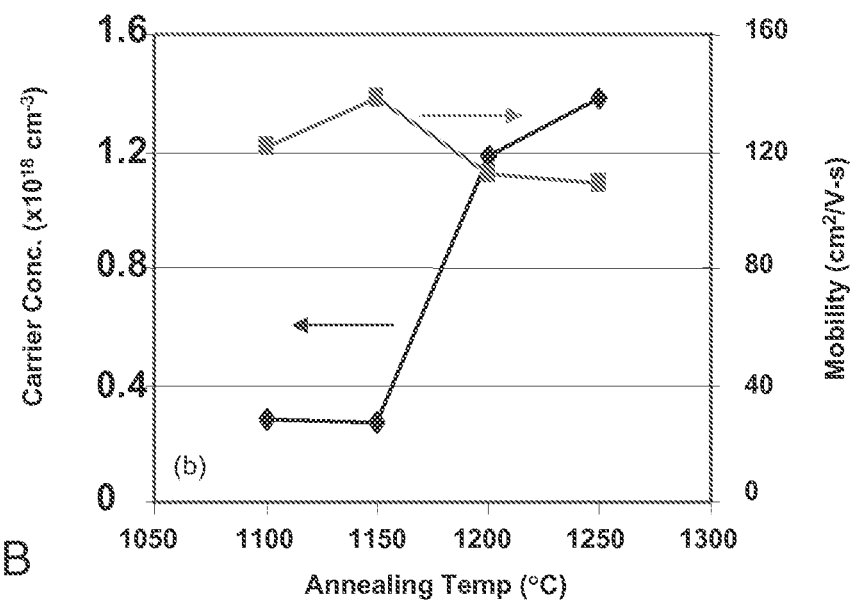

FIG. 8 graphically illustrates net donor concentration and electron mobility for samples annealed for 30 min at 1100, 1150, 1200 and 1250° C. for Si box implantation concentrations of (a) $5 \times 10^{17}$ and (b) $1 \times 10^{19}$ cm$^{-3}$. As shown in FIG. 8A, the percent activation increases with the annealing temperature for the sample implanted to $5 \times 10^{17}$ cm$^{-3}$, with the largest increase being between 1200 and 1250° C.; at 1250° C. the percent activation is 70%. This result is very encouraging for the highest annealing temperature we can achieve. The results for the sample implanted to $10^{19}$ cm$^{-3}$ are not quite as good, as the percent activation was only 15%. This is not such a bad result, however, because implants to this high concentration are often used to lower the contact resistance where the percent activation is not as important.

Direct comparisons often cannot be made with other work because single, as opposed to box implants, were made, the dose is frequently quite high, and the samples were RTA annealed. In Y. Irokawa et al., J. Appl. Phys. 97, 83505 (2005), a box implant was used, the silicon concentration was 2.5× $10^{18}$ cm$^{-3}$, and the sample was furnace annealed for 5 min at temperatures between 1100-1400° C. using an $SiO_2$ cap. They show large increases in the percent activation between 1200 and 1250° C. and between 1250 and 1300° C., with the percent activation at 1300° C. being 60%. The percent activation continues to increase more slowly between 1300 and 1400° C. where it reaches 100%. Because no information about the quality of the GaN or the $SiO_2$ cap was presented, it cannot be ascertained as to whether or not the cap broke down in places and some nitrogen vacancies were formed and contributed to the carrier concentration. Given that the N partial pressure exceeded the fracture strength of the $SiO_2$ film, it is likely that they did. In an earlier work Irokawa et al used a similar set up that differed only in that the samples were RTA annealed, and $T_A$ ranged from 1000-1200° C. They found that the percent activation increased almost linearly with $T_A$, and was 30% after the 1200° C. anneal when the annealing time was 2 min. They also demonstrated that the percent activation increased sublinearly with time from 12-30% at 1200° C. when the annealing time was increased from 0.5-2 min. Considering that the box implant concentration was $5.5 \times 10^{18}$ cm$^{-3}$, these results are quite similar to ours. Nakano et al also used an $SiO_2$ cap and annealed their samples for 5 min at temperatures between 1100-1300° C., but they used a single implant of $10^{15}$ cm$^{-2}$ at 65 keV. They determined that the activation was ~50% after a 1300° C. anneal, and that the activation increased sublinearly with time until t=300 sec where it plateaus. It is likely that nitrogen vacancies contribute to the conductivity in their samples at least after the 1300° C. anneal, as they acknowledge that some gallium droplets were formed on the surface. Matsunaga et al also used only a single implant of $10^{15}$ cm$^{-2}$ (at 150 keV) and samples were annealed at temperatures between 800-1300° C., but their samples were RTA annealed with a $Si_3N_4$ cap. They achieve activation percents of 79-86% at 1300° C., but again these results are suspect because some nitrogen had evaporated creating hexagonal pits in the surface. Using a thin AlN cap deposited by MBE at 100° C., (see J. A. Fellows, et al., Appl. Phys. Lett. 80, 1930 (2002)). RTA annealed samples at temperatures from 1050-1350° C. that had been implanted once at 200 keV over the range of $10^{13}$-$5\times10^{15}$ cm$^{-2}$. They concluded that they obtained 100% activation for samples implanted to $10^{15}$ cm$^{-2}$ and annealed at 1350° C., but only 42% activation for samples implanted to $10^{13}$ cm$^{-2}$. They attribute this unusual trend to silicon donors not being thermally activated into the conduction band at the low, non-degenerate concentration, but the donor depth is too small to support this explanation. The issue is more complex with one of the complicating issues possibly being an incoherent cap at the higher annealing temperatures given that a thin, low temperature deposited cap was not very strong. As reported by X. A. Cao, et al., using a thicker, sputtered AlN cap, RTA annealed samples at temperatures from 1100-1500° C. that had been implanted once at 100 keV to $5\times10^{15}$ cm$^{-2}$. They concluded they obtained 100% activation annealing at 1400° C., but given the porosity of the cap, it seems likely they could not have obtained this result without thermally damaging the GaN. The fact that the percent activation drops for the 1500° C. anneal supports this contention.

The mobility of the sample implanted to $5\times10^{17}$ cm$^{-3}$ generally increases with the annealing temperature reaching a value of 240 cm$^2$/V·s after the 1250° C. anneal. Given that the dislocation concentration of our GaN films is in the mid $10^9$ cm$^{-2}$ range, this mobility compares quite favorably with the value of 250-300 cm$^2$/V·s for samples doped in situ to this concentration as determined both theoretically and experimentally, (see H. M. Ng, et al. Appl. Phys. Lett. 73, 821 (1998) and S. Nakamura, et al, J. Appl. Phys. 71, 5543 (1992), respectively) For the sample implanted to $10^{19}$ cm$^{-3}$, the mobility generally decreases slowly as the annealing temperature increases suggesting that the increased ionized donor scattering slightly dominates the effects of reducing the number of point defects through annealing. The value of 112 cm$^2$/V·s at 1250° C. compares quite favorably with the theoretical (Ng, et al) and experimental (Nakamura, et al,), values of 125-150 cm$^2$/V·s for in situ doped GaN doped to the same concentration.

With a box implant to $2.5\times10^{18}$ cm$^{-3}$ Irokawa et al found that the mobility decreased slowly to a value of 72 cm$^2$/V·s as $T_A$ increased up to 1300° C., but it then increased to 125 cm$^2$/V·s for $T_A$ equal to 1350 and 1400° C. Given that the cap was at least partially destroyed by the large N partial pressure, it is likely that nitrogen vacancies were formed at these temperatures and contributed to the rise in the value of the mobility. One to one comparisons cannot be made with other work because they used single implants, but meaningful insights can be gained by comparing samples whose peak concentration is the same as the concentration of the box implant. Nakano et al found that for the lowest dose of $10^{13}$ cm$^{-2}$, which has a peak concentration of ~$6\times10^{17}$ cm$^{-3}$, the mobility was 225 cm$^2$/V·s after an anneal at 1300° C. They found it decreased with increasing $T_A$ to 125 cm$^2$/V·s when the dose was $10^{14}$ cm$^{-2}$, and to 100 cm$^2$/V·s when the dose was $10^{15}$ cm$^{-2}$.

A dual AlN cap was found to be effective for annealing Si-implanted GaN up to a temperature of 1250° C. in that it did not allow the nitrogen to preferentially evaporate. The cap is composed of a thin (80 nm) adhesion layer formed by depositing AlN at 600° C. by MOCVD, followed by the deposition of a thick (1 μm) AlN film by sputtering at 500° C. to insure complete coverage and to give the cap added strength. A physical analysis of the surface shows that the AlN is not cracked and does not contain any blow holes, and cross section TEM shows that the thin MOCVD layer has good adhesion, and the thick sputtered layer contains only a few voids. An analysis of the surface of the GaN with the AlN cap etched off also shows that the only etch pits that are formed are a few thermal etch pits formed at micropipes; there are not any thermal etch pits formed by the preferential evaporation of N that would severely roughen the surface. A theoretical analysis of the vapor pressure of the nitrogen in equilibrium with the GaN shows that it is equal to the yield strength of AlN at ~1250° C. suggesting this is the maximum temperature to which the GaN can be raised since at higher temperatures the nitrogen pressure would be large enough to fracture the cap. This analysis suggests that data obtained by others who annealed their samples at higher temperatures probably had some contributions to the electrical characteristics from nitrogen vacancies as well as the activated silicon implants.

Although the surface of the GaN does not contain any blow holes when it is annealed at 1250° C., the surface does reconstruct at this temperature making the individual crystallites in the film more visible. In so doing the surface becomes rougher. The driving force for this to occur is a lowering of the surface energy via solid state diffusion. A cross section HRTEM analysis of an implanted, but not annealed, sample and one that was annealed at 1250° C. show that some solid state diffusion does occur during the anneal, as the sample that was annealed contains larger stacking faults.

A Hall effect analysis of the samples implanted with silicon to $5\times10^{17}$ cm$^{-3}$ shows that the percent activation increases with the annealing temperature reaching 70% at 1250° C. The mobility also generally increases with $T_A$, and reaches a value of 240 cm$^2$/V·s at 1250° C. This is only slightly less than that which is expected for samples doped in situ to the same concentration and with the same dislocation concentration suggesting that much of the implant damage has been annealed out. For the samples implanted to $10^{19}$ cm$^{-3}$, the percent activation increases with $T_A$ and reaches a value of 15% at 1250° C. The mobility decreases very slowly with $T_A$ because the increased scattering from ionized donors as the activation increases is dominant, and it reaches a value of 112 cm$^2$/V·s at 1250° C. This is also close to the value of in situ doped GaN with the same doping concentration.

What is claimed is:

1. A method of preventing the escape of nitrogen during the activation of ion implanted dopants in a Group III-nitride semiconductor without thermally damaging the Group III-nitride semiconductor comprising:
   depositing a first layer of another Group III-nitride that acts as an adhesion layer onto the Group III-nitride semiconductor;
   depositing a second polycrystalline layer of a Group III-nitride that acts as a mechanical supporting layer;
   said first and second layers forming an annealing cap to prevent the escape of the nitrogen component of the Group III-nitride semiconductor at temperatures required to activate the implants during the activation anneal for the annealing temperatures in the range of approximately 1100 to 1250° C.

2. The method of claim 1 wherein the depositing a first layer of another Group III-nitride is formed at a temperature of approximately 600° C. by epitaxy deposition of a thin aluminum nitride (Aln) film, and wherein the annealing temperature during the activation anneal is in the range of approximately 1100 to 1250° C.

3. The method of claim 1, wherein the thickness of the first layer is in the range of approximately 30 to 130 nm; and wherein the first layer is deposited by metal organic chemical vapor deposition (MOCVD).

4. The method of claim 1 wherein the thickness of the first layer is in the range of approximately 30 to 130 nm; and wherein the first layer is deposited by epitaxy.

5. The method of claim 2, wherein the step of depositing a second layer comprises depositing a thicker polycrystalline Aln film of at least one half micron to give the cap sufficient strength to withstand the large nitrogen pressure from the Group III-nitride semiconductor.

6. The method of claim 3, wherein the step of depositing a second layer comprises depositing a layer of Aln at least one half micron thick to give the cap sufficient strength to withstand the pressure of and prevent the escape of nitrogen from the Group III-nitride semiconductor.

7. The method of claim 5 wherein the at least one half micron layer may be formed by a deposition process such as sputtering or pulsed laser deposition.

8. The method of claim 1, wherein the annealing cap is selectively removed by etching after the anneal procedure has been completed.

9. The method of claim 1 wherein the first layer is formed by an 80 nm Aln layer deposited by MOCVD at 600° C. and the second layer comprises an at least one half micron Aln layer deposited at 500° C.

10. A method of preventing the escape of nitrogen during the activation of ion implanted dopants in a Group III-nitride semiconductor without damaging the Group III-nitride semiconductor comprising:
  depositing a first layer of another Group III-nitride that acts as an adhesion layer onto the Group III-nitride semiconductor;
  depositing a second layer of a Group III-nitride that acts as a mechanical supporting layer; said first and second layers forming an annealing cap to prevent the escape of the nitrogen component of the Group III-nitride semiconductor;
  annealing the Group III-nitride semiconductor at a temperature in the range of approximately 1100-1250° C.; and
  selectively removing the first and second layers from the Group III-nitride semiconductor without damaging said Group III-nitride semiconductor.

11. The method of claim 10 wherein the first and second layers are removed by etching using a warm KOH solution.

12. The method of claim 10 wherein the first layer is formed by Aln layer having a thickness in the range of approximately 30 to 130 nanometers deposited by MOCVD at approximately 600° C. and the second layer comprises an Aln layer deposited at approximately 500° C.

13. The method of claim 12 wherein the thickness of the Aln layer is at least approximately one half micron.

14. The method of claim 10 wherein the first layer is formed by an Aln layer having a thickness in the range of 30 to 130 nanometers deposited by epitaxy at approximately 600° C. and the second layer comprises a sputtered Aln layer deposited at approximately 500° C.

15. The method of claim 14 wherein the thickness of the sputtered Aln layer is at least approximately one half micron.

16. The method of claim 10 wherein the depositing a first layer of another Group III-nitride is formed at a temperature of approximately 600° C. by epitaxy deposition of a thin aluminum nitride (AlN) film.

17. The method of claim 10, wherein the thickness of the first layer is in the range of approximately 30 to 130 nm; and wherein the first layer is deposited by metal organic chemical vapor deposition (MOCVD).

18. The method of claim 10 wherein the thickness of the first layer is in the range of approximately 30 to 130 nm; and wherein the first layer is deposited by molecular beam epitaxy.

19. The method of claim 10 wherein the removing of the first and second layers is by etching with potassium hydroxide (KOH).

20. A semiconductor device comprising a doped Group III-nitride semiconductor formed by a method comprising:
  depositing a first layer of another Group III-nitride that acts as an adhesion layer onto the Group III-nitride semiconductor;
  depositing a second layer of a Group III-nitride that acts as a mechanical supporting layer; said first and second layers forming an annealing cap to prevent the escape of the nitrogen component of the Group III-nitride semiconductor;
  implanting dopant ions using dopant concentrations in the range of $5\times10^{17}$ to $1\times10^{19}$ cm$^{-3}$, each dopant ion being capable of creating a charge carrier in the seminconductor thus modifying the conductivity of the semiconductor in its vicinity by providing increased electron mobility or carrier concentration depending upon if it is a p-type or n-type dopant;
  annealing the Group III-nitride semiconductor at a temperature in the range of approximately 1150-1250° C. for up to 30 minutes while the first and second layers prevent the escape of nitrogen from the Group III-nitride into the atmosphere; the annealing operating to repair damage caused by the implantation of the ions into the Group III-nitride semiconductor and facilitate implanted ions in finding suitable sites in the lattice of the Group III-nitride semiconductor;
  whereby dopants are implanted into the semiconductor material using an implanting process having implantation concentrations of between approximately $5\times10^{17}$ to approximately $1\times10^{19}$ cm$^{-3}$, and wherein the Group III-nitride semiconductor is annealed in the temperature range of 1150-1250° C. for up to 30 minutes resulting in the percent of the number of dopants implanted being in a range of 14 to 70 percent of the implantation concentration.

* * * * *